United States Patent
Kang et al.

(10) Patent No.: US 7,896,051 B2
(45) Date of Patent: Mar. 1, 2011

(54) SEMICONDUCTOR DIE BONDING APPARATUS HAVING MULTIPLE BONDING HEAD UNITS

(75) Inventors: Byung Chul Kang, Gyeonggi-do (KR); Kwang Duck Koh, Seoul (KR); Jum Dong Lee, Gyeonggi-do (KR); Hwa Seob Lee, Gyeonggi-do (KR); Jae Moo Shin, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 253 days.

(21) Appl. No.: 11/954,368

(22) Filed: Dec. 12, 2007

(65) Prior Publication Data
US 2009/0120589 A1    May 14, 2009

(30) Foreign Application Priority Data
Nov. 9, 2007 (KR) .................... 10-2007-0114270

(51) Int. Cl.
B32B 37/12 (2006.01)
B32B 37/00 (2006.01)

(52) U.S. Cl. .................. 156/539; 156/511; 156/518; 156/521; 156/538; 156/499; 156/556; 228/6.1; 228/4.1; 228/49.1

(58) Field of Classification Search .............. 156/518, 156/511, 515, 521, 530, 499, 560, 556, 539; 228/9, 49.5, 105, 6.2, 4.5, 49.1, 3.5, 6.1, 228/4.1
See application file for complete search history.

(56) References Cited

U.S. PATENT DOCUMENTS

| | | | | |
|---|---|---|---|---|
| 5,397,423 A | * | 3/1995 | Bantz et al. | 156/362 |
| 5,952,725 A | * | 9/1999 | Ball | 257/777 |
| 5,979,739 A | * | 11/1999 | Jin et al. | 228/6.2 |
| 6,012,502 A | * | 1/2000 | VanNortwick et al. | 156/518 |
| 6,223,800 B1 | * | 5/2001 | Kim et al. | 156/556 |
| 6,432,497 B2 | * | 8/2002 | Bunyan | 428/40.1 |
| 6,820,792 B2 | * | 11/2004 | Kim et al. | 228/9 |
| 6,863,109 B2 | * | 3/2005 | Kim et al. | 156/556 |
| 7,028,397 B2 | * | 4/2006 | Abe et al. | 29/840 |
| 7,568,606 B2 | * | 8/2009 | Wong et al. | 228/43 |
| 2005/0081986 A1 | * | 4/2005 | Kwon et al. | 156/249 |

FOREIGN PATENT DOCUMENTS

| | | |
|---|---|---|
| KR | 1020020046288 A | 6/2002 |
| KR | 1020070019047 A | 2/2007 |

* cited by examiner

*Primary Examiner*—Khanh Nguyen
*Assistant Examiner*—Keith T Aziz
(74) *Attorney, Agent, or Firm*—Ladas & Parry LLP

(57) ABSTRACT

A die bonding apparatus is presented which is capable of realizing different semiconductor packages, for example, a face up package and a face down package in a single die bonding apparatus. The die bonding apparatus includes a substrate transportation unit for transporting a substrate. A first bonding head unit is included which has a first bonding head for bonding a semiconductor chip disposed in a mount table adjacent to the substrate transportation unit over the substrate. A die transportation unit is included for transporting the semiconductor chip disposed in a mount table to a mount stage disposed at a lower portion of the substrate. A second bonding head unit is included in which the mount stage and a second bonding head disposed at an upper portion of the substrate corresponding to the mount stage and bonding the semiconductor chip disposed in the mount stage to the lower portion of the substrate.

16 Claims, 3 Drawing Sheets

SEMICONDUCTOR DIE BONDING APPARATUS HAVING MULTIPLE BONDING HEAD UNITS

CROSS-REFERENCE TO RELATED APPLICATIONS

The present application claims priority to Korean patent application number 10-2007-0114270 filed on Nov. 9, 2007, which is incorporated herein by reference in its entirety.

BACKGROUND OF THE INVENTION

The present invention relates to a die bonding apparatus.

In general, a semiconductor product is fabricated through a semiconductor chip fabrication process for fabricating a semiconductor chip which is capable of storing and processing data over a silicon wafer made of high pure silicon, a die sorting process for electrically inspecting the semiconductor chip and a packaging process for packaging a good semiconductor chip.

The semiconductor chip fabricated by the semiconductor chip fabrication process is fabricated to various semiconductor products by the packaging process.

For example, the semiconductor product may be classified into a face up package in which the semiconductor chip is disposed over an upper surface of a substrate and lead frame and a face down package in which the semiconductor chip is disposed over a lower surface of a substrate and lead frame.

The face up package includes a general normal package and a stacked package in which a plurality of semiconductor chips are stacked and the face down package includes a lead on chip package and a board on chip package.

Conventionally, there has been a problem that different kinds of die bonding apparatus are necessary to fabricate the face up package and the face down package.

SUMMARY OF THE INVENTION

Embodiments of the present invention are directed to a die bonding apparatus which is capable of bonding a semiconductor chip over an upper surface of a substrate and lead frame or bonding a semiconductor chip over a lower surface of a substrate and lead frame.

In one embodiment, a die bonding apparatus comprises a substrate transportation unit for transporting a substrate; a first bonding head unit including a first bonding head for bonding a semiconductor chip disposed in a mount table adjacent to the substrate transportation unit over the substrate; a die transportation unit for transporting the semiconductor chip disposed in a mount table to a mount stage disposed at a lower portion of the substrate; and a second bonding head unit including the mount stage and a second bonding head disposed at an upper portion of the substrate corresponding to the mount stage and bonding the semiconductor chip disposed in the mount stage to the lower portion of the substrate.

The die bonding apparatus may further comprise a substrate loader disposed at a first end portion of the substrate transportation unit and on which the substrate to be bonded with the semiconductor chip is loaded; and a substrate unloader disposed at a second end portion of the substrate transportation unit, the second end portion opposing to the first end portion, and on which the substrate bonded with the semiconductor chip is loaded.

The die bonding apparatus may further comprise a pre-bake unit disposed adjacently to the substrate transportation unit and pre-baking the substrate at a specific temperature for a specific time.

The pre-bake unit includes a pre-bake oven for pre-baking the substrate; a loading/unloading unit for loading/unloading the substrate to the pre-bake oven; and a loader arm for transporting the substrate between the substrate transportation unit and the loading/unloading unit.

The die bonding apparatus may further comprise an adhesive member forming unit disposed adjacently to the substrate transportation unit and disposing an adhesive member at the substrate.

The adhesive member forming unit includes an adhesive member roll wound with an adhesive member which exhibits adhesiveness when heat; a cutting unit for the adhesive member to a specific length; and a pick-up unit for picking up the adhesive member cut by the cutting unit to the substrate.

The pick-up unit may include a dispenser unit for providing an adhesive material to the substrate.

The die bonding apparatus may further comprise a die supplying device including a cassette disposed adjacently to the mount table and receiving a mount frame having a mount tape to which the singulated semiconductor chip is attached, and a mount frame transportation unit for transporting the mount frame from the cassette to the mount table.

The die bonding apparatus may further comprise a camera for photographing the semiconductor chip in the mount frame.

The first head bonding unit includes a first pick-up unit for picking up the semiconductor chip disposed in the mount table; and a first transportation unit for transporting the first pick-up unit to the substrate disposed in the substrate transportation unit.

The die transportation unit includes a second pick-up unit for picking up the semiconductor chip disposed in the mount table; and a second transportation unit for reciprocating the second pick-up unit between the mount table and the mount stage.

The mount stage includes a first mount stage transportation unit for transporting the mount stage in a direction parallel to the substrate; and a second mount stage transportation unit for transporting the mount stage in a direction perpendicular to the substrate.

The die bonding apparatus may further comprise a second bonding head transportation unit for transporting the second bonding head in a direction perpendicular to the substrate.

The die bonding apparatus may further comprise a camera disposed above the substrate transportation unit and photographing the semiconductor chip attached by the first bonding head unit.

The die bonding apparatus may further comprise a camera disposed above the mount stage and photographing positions of the mount stage and the semiconductor chip provided to the mount stage.

The substrate provided to the substrate transportation unit may be a printed circuit board.

The substrate provided to the substrate transportation unit may be a lead frame having a release tape.

The substrate transportation unit may further include a release tape separation unit for separating the release tape.

DESCRIPTION OF SPECIFIC EMBODIMENTS

Hereafter, terms frequently used in the present invention will be defined.

The term "substrate", which is frequently used in the present invention, is defined as a member on which a semiconductor chip is mounted, for example, as a "printed circuit board" or a "lead frame".

The term "face up package", which is frequently used in the present invention, is defined as a semiconductor package in which a semiconductor chip is disposed over an upper surface of the "substrate".

The term "face down package", which is frequently used in the present invention, is defined as a semiconductor package in which a semiconductor chip is disposed over a lower surface of the "substrate".

Figure 1:
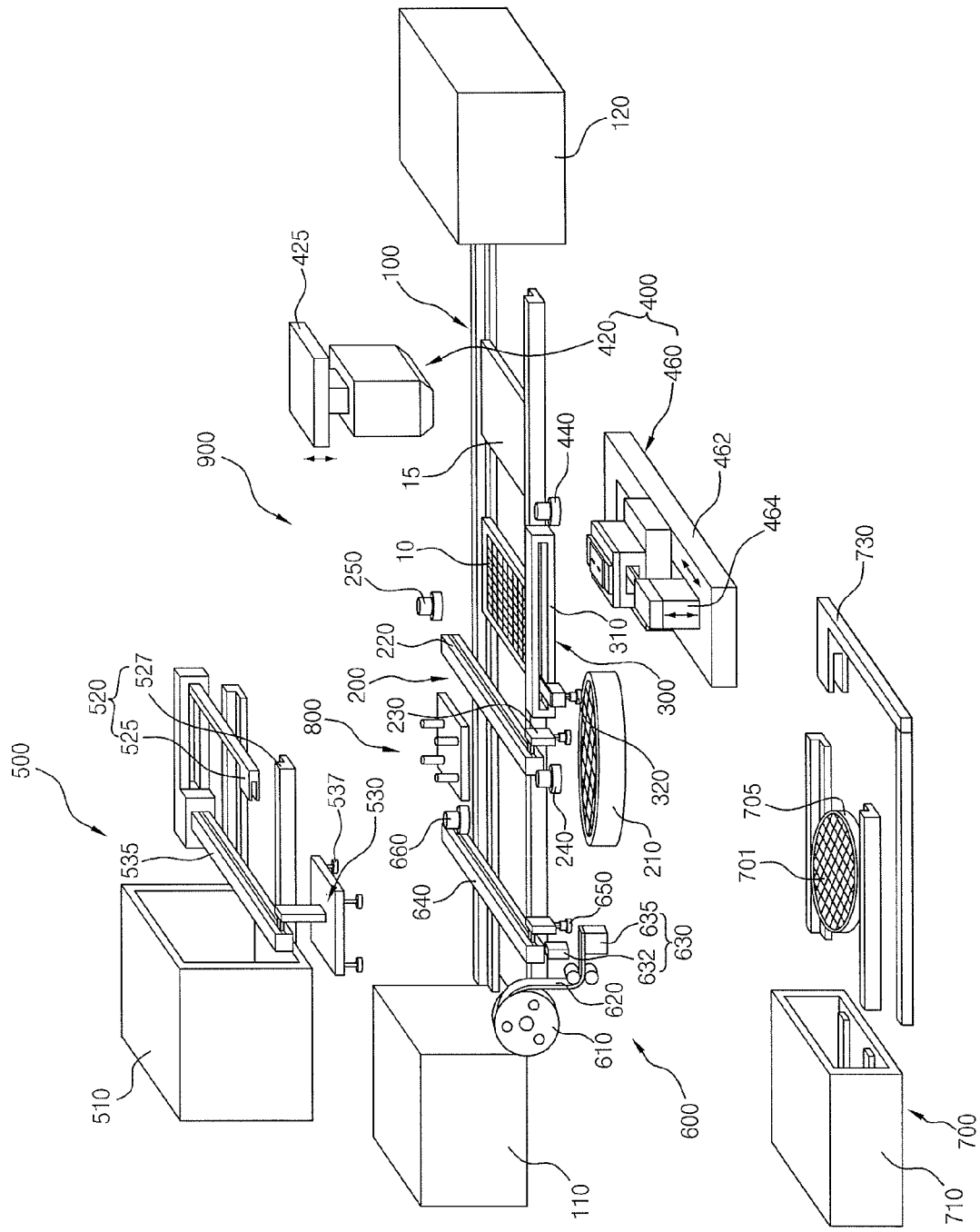
FIG. 1 is a perspective view illustrating a die bonding apparatus in accordance with an embodiment of the present invention.

FIG. 1 is a perspective view illustrating a die bonding apparatus in accordance with an embodiment of the present invention.

Referring to FIG. 1, a die bonding apparatus 900 includes a substrate transportation unit 100, a first bonding head 200, a die transportation unit 300 and a second bonding head 400.

The substrate transportation unit 100 transports a face up package substrate 10 a face down package substrate 15 from a first position FP to a second position SP at a specific distance from the first position FP. The substrate transportation unit 100 may have a substrate transportation rail for transporting the face up package substrate 10 or the face down package substrate 15 from the first position FP to the second position SP.

The die bonding apparatus 900 may further include a substrate loader 110 and a substrate unloader 120.

The substrate loader 110 is disposed at the first position FP and the substrate loader 110 may receive a plurality of the face up package substrates 10 and/or the face down package substrates 15 on which a semiconductor chip is to be mounted by the die bonding apparatus 900.

The substrate unloader 120 is disposed at the second position SP and the substrate unloader 120 may receive a plurality of the face up package substrates 10 and/or the face down package substrates 15 on which a semiconductor chip has been mounted by the die bonding apparatus 900.

Figure 2:
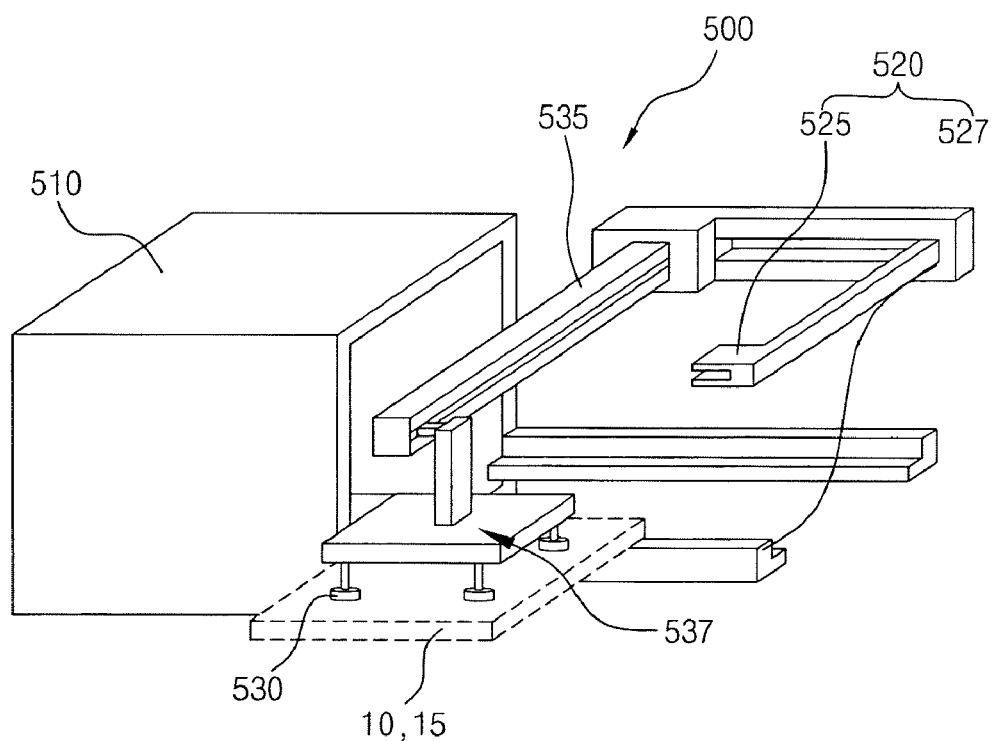
FIG. 2 is a perspective view illustrating a pre-bake unit shown in FIG. 1.

FIG. 2 is a perspective view illustrating a pre-bake unit shown in FIG. 1.

Referring to FIGS. 1 and 2, the die bonding apparatus 900 may further include a pre-bake unit 500.

The pre-bake unit 500 is disposed at a position adjacent to the substrate transportation unit 100 and the substrate loader 110.

The pre-bake unit 500 bakes the face up package substrate 10 or the face down package substrate 15 unloaded from the substrate loader 110 to the substrate transportation unit 100 at a specific temperature for a specific time.

The pre-bake unit 500 includes a pre-bake oven 510, a loading/unloading unit 520 and a loader arm 530.

The loader arm 530 transports the face up package substrate 10 or the face down package substrate 15 from the loading/unloading unit 520 to the substrate transportation unit 100 or from the substrate transportation unit 100 to the loading/unloading unit 520.

The loader arm 530 includes a straight reciprocating transportation device 535 and a picker 537.

The straight reciprocating transportation device 535 moves the picker 537 between the loading/unloading unit 520 and the substrate transportation unit 100.

The picker 537 absorbs the face up package substrate 10 or the face down package substrate 15 using, for example, a vacuum pressure.

The loading/unloading unit 520 loads the face up package substrate 10 or the face down package substrate 15 transported by the loader arm 530 into the pre-bake oven 510 or unload the face up package substrate 10 or the face down package substrate 15 from the pre-bake oven 510.

The loading/unloading unit 520 includes a driving unit 525 and a transportation rail 527.

The driving unit 525 loads the face up package substrate 10 or the face down package substrate 15 transported by the loader arm 530 to the transportation rail 527 into the pre-bake oven 510 or unload the face up package substrate 10 or the face down package substrate 15 from the pre-bake oven 510.

The pre-bake oven 510 pre-bakes the face up package substrate 10 or the face down package substrate 15 at a specific temperature for a specific time.

The pre-bake oven 510 may include a heater unit (not shown) for heating the face up package substrate 10 or the face down package substrate 15.

Figure 3:
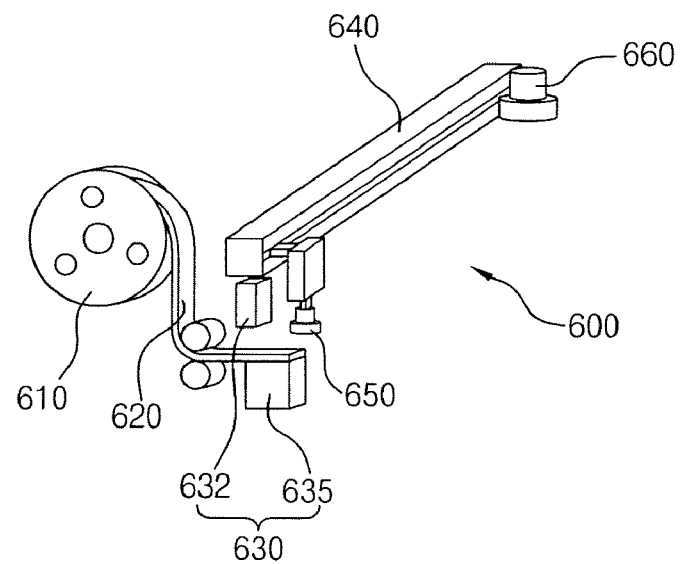
FIG. 3 is a perspective view illustrating an adhesive member forming unit shown in FIG. 1.

FIG. 3 is a perspective view illustrating an adhesive member forming unit shown in FIG. 1.

Referring to FIGS. 1 and 3, the die bonding apparatus 900 may further include an adhesive member forming unit 600.

The adhesive member forming unit 600 is disposed adjacently to the substrate transportation unit 100 and the adhesive member forming unit 600 attaches an adhesive member to the face up package substrate 10.

In the present embodiment, the adhesive member may include, for example, an epoxy adhesive member or an adhesive tape which is melted by heat to have an adhesive force.

The adhesive member forming unit 600 includes an adhesive member roll 610, a cutting unit 630, a straight reciprocating transportation device 640 and a pick-up unit 650.

The adhesive member forming unit 600 may further include, for example, a camera 660 for photographing the face up package substrate 10 or the face down package substrate 15 disposed at the substrate transportation unit 100.

The adhesive member roll 610 includes an adhesive tape of a reel shape which exhibits an adhesive force when heated. The adhesive tape 620 may includes a release tape and the adhesive tape 620 is wound on the adhesive member roll 610.

The cutting unit 630 includes a cutter 632 for cutting the adhesive tape 620 and a support block 635 for supporting the cut adhesive tape 620.

The straight reciprocating transportation device 640 reciprocates between the support block 635 of the cutting unit 630 and the substrate transportation unit 100 in which the face up package substrate 10.

The pick-up unit 650 picks up the adhesive tape 620 disposed over the support block 635 and transports it to the face up package substrate 10 by the straight reciprocating transportation device 640.

Meanwhile, the adhesive member forming unit 600 may further include a dispenser unit for providing an adhesive including an epoxy resin to the face up package substrate 10, together with the pick-up unit 650 for picking up the adhesive tape 620. Alternatively, the adhesive member forming unit 600 may include a dispenser unit for providing an epoxy resin adhesive to the face up package substrate 10, instead of the pick-up unit 650 for picking up the adhesive tape 620.

Referring again to FIG. 1, the die bonding apparatus 900 further include a die supplying device 700.

The die supplying device 700 includes a cassette 710 and a mount frame transportation unit 730.

The cassette 710 of the die supplying device 700 includes a plurality of mount frames 705. A mount tape (not shown) is used to attach the semiconductor chips 701 to the mount frame 705.

The mount frame transportation unit 730 unloads the mount frame 705 on which semiconductor chips 701 are disposed from the cassette 710 and transports the unloaded mount frame 705 onto the mount table 210 (described below).

The die supplying device 700 may further include a Charge Coupled Digital (CCD) camera (240 or 660) for photographing a lot number and a bar code included in the semiconductor chip 701 to obtain information of the semiconductor chip 701.

Figure 4:
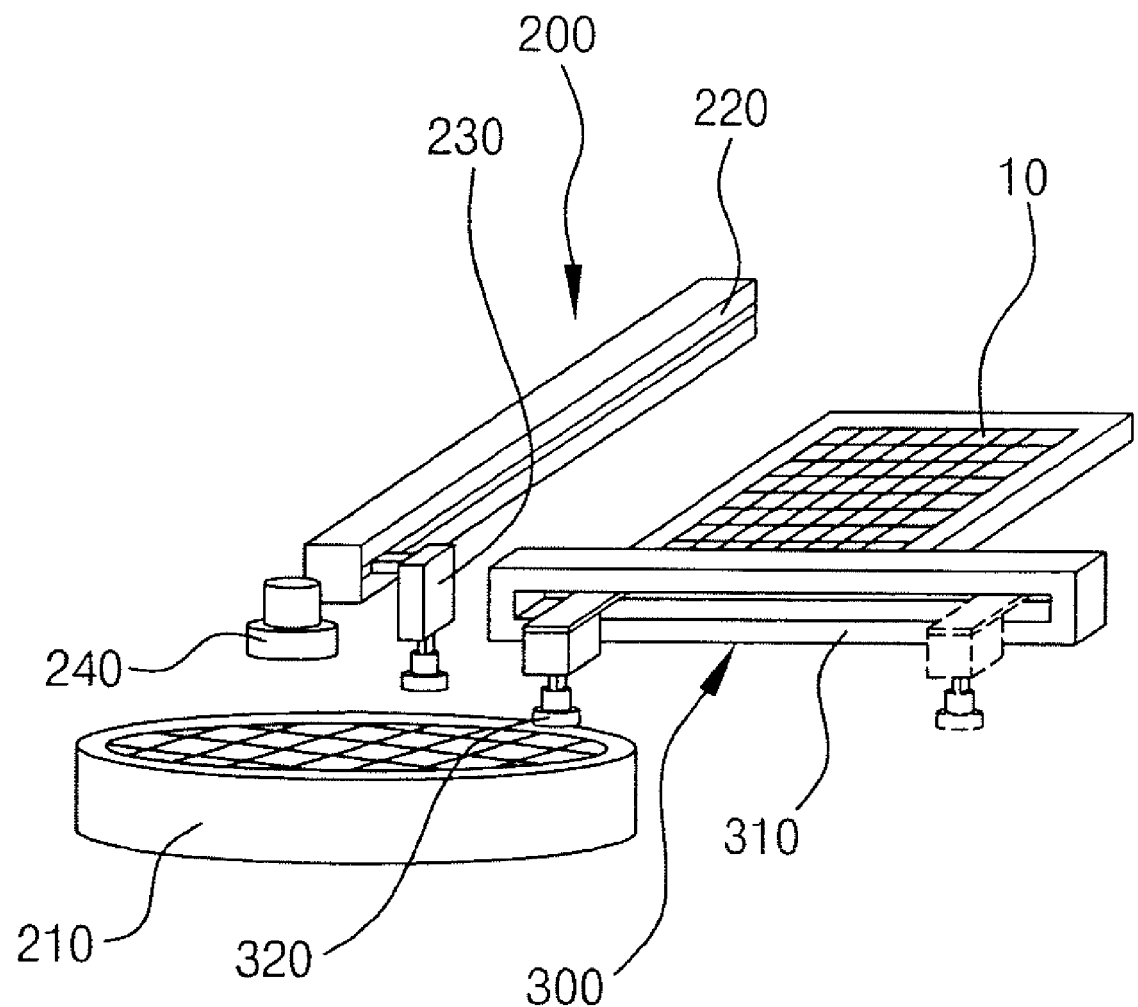
FIG. 4 is a perspective view illustrating a first bonding head unit shown in FIG. 1.

FIG. 4 is a perspective view illustrating a first bonding head unit shown in FIG. 1.

Referring to FIGS. 1 and 4, the first bonding head unit 200 included in the die bonding apparatus 900 bonds the semiconductor chip 701 disposed over the mount frame 705 disposed in the mount table 210 adjacent to the substrate transportation unit 100 onto an upper surface of the face up package substrate 10.

The first bonding head unit 200 includes a first transportation unit 220 and a first bonding head 230.

The first transportation unit 220 reciprocates between the mount table 210 and the face up package substrate 10 disposed in the substrate transportation unit 100.

The first bonding head 230 picks up the semiconductor chip 701 from the mount table 210 and bonds the semiconductor chip 701 onto the upper surface of the face up package substrate 10 on which the adhesive member is disposed. An optional camera 240 for photographing the face up package substrate 10.

Referring again to FIG. 1, the die transportation unit 300 is disposed at a position adjacent to the mount table.

The die transportation unit 300 includes a second transportation unit 310 and a pick-up head 320.

The second transportation unit 310 reciprocates between the mount table 210 on which the semiconductor chips 701 are disposed and a mount stage 460 of the second bonding head unit 400 which will be described in later.

The pick-up head 320 picks up the semiconductor chip 701 from the mount table 210 to provide the semiconductor chip 701 onto the mount stage 460 of the second bonding head unit 400. The second transportation unit 310 of the die transportation unit 300 may be disposed, for example, in a direction substantially in parallel to the substrate transportation unit 100.

Referring again to FIG. 1, the second bonding head unit 400 of the die bonding apparatus 900 includes the mount stage 460 and the second bonding head 420.

The mount stage 460 is disposed at a lower of the face down package substrate 15 disposed in the substrate transportation unit 100.

The mount stage 460 includes a first mount stage transportation unit 462 and a second mount stage transportation unit 464.

The first mount stage transportation unit 462 transports the mount stage 460 in a direction substantially in parallel to the face down package substrate 15 disposed in the substrate transportation unit 100.

The second mount stage transportation unit 464 transports the mount stage 460 in a direction perpendicular to the face down package substrate 15 disposed in the substrate transportation unit 100.

The second bonding head 420 is disposed at an upper portion of the face down package substrate 15 disposed in the substrate transportation unit 100. The second bonding head 420 is aligned over the face down package substrate 15. The second bonding head 420 includes a second bonding head transportation unit 425 for transporting the second bonding head 420 toward the face down package substrate 15.

By the second bonding head transportation unit 425 and the first and second mount stage transportation units 462 and 464, the semiconductor chip 701 disposed over the mount stage 460 when mounted over the face down package substrate 15.

The second bonding head 420 may further include a CCD camera 440 for photographing the mount stage 460 and the semiconductor chip 701 disposed over the mount stage 460 to obtain information related to a position of the mount stage 460 and a position of the semiconductor chip 701.

In FIG. 1, reference numeral 800 which is not described designates a release tape separation unit for separating the release tape (not shown) attached to the lead frame from the lead frame when the substrate provided to the substrate transportation unit is the lead frame.

Hereafter, an operation of the die bonding head 900 in accordance with an embodiment of the present invention will be described with reference to the accompanying drawings.

First, when the face up package substrate 10 is provided from the substrate loader 110 to the substrate transportation unit 100, the face up package substrate 10 is, for example, pre-baked in the pre-bake unit 500.

The pre-baked face up package substrate 10 is again provided to the substrate transportation unit 100 and the adhesive member is attached to the face up package substrate 10 by the adhesive member forming unit 600.

Subsequently, the first bonding head 230 of the first bonding head unit 200 picks up the semiconductor chip 701 from the mount table 210 to attach it to the face up package substrate 10.

The face up package substrate 10 to which the semiconductor chip 701 is attached is received in the substrate unloader 120 along the substrate transportation unit 100.

Meanwhile, when the face down package substrate 15 is provided from the substrate loader 110 to the substrate transportation unit 100, the face down package substrate 15 is, for example, pre-baked in the pre-bake unit 500.

The pre-baked face down package substrate 15 is again provided to the substrate transportation unit 100.

Subsequently, the semiconductor chip 701 disposed over the mount table 210 is disposed over the mount stage 460 disposed adjacently to the die transportation device 300 by the die transportation device 300.

After the semiconductor chip 701 is disposed over the mount stage 460, the semiconductor chip 701 is thermocompression bonded to the lower portion of the face down package substrate 15 by the mount stage 460 and the second bonding head 420 opposing to the mount stage 460.

The face down package substrate 15 to which the semiconductor chip 701 is attached is received in the substrate unloader 120 along the substrate transportation unit 100.

As is apparent from the above description, the die bonding apparatus in accordance with the present invention has an advantage that it is possible to realize different semiconductor packages, for example, a face up package and a face down package in a single die bonding apparatus.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A die bonding apparatus, comprising:
a substrate transportation unit for transporting a first substrate and a second substrate;
a mount table disposed adjacently to the substrate transportation unit and adapted to loading a plurality of semiconductor chips;
a first bonding head unit including a first bonding head for bonding as least one of the semiconductor chips loaded in said mount table to an upper portion of the first substrate;
a die transportation unit for transporting at least one of the semiconductor chips loaded in said mount table to a mount stage disposed at a lower portion of the second substrate;
a second bonding head unit including the mount stage and a second bonding head disposed at an upper portion of the second substrate corresponding to the mount stage and adapted to bonding at least one of the semiconductor chips disposed in the mount stage to the lower portion of the second substrate, wherein the ratio of bonding head units to mount stages is at least 2 to 1;
wherein the first bonding head unit comprises:
a first pick-up unit for picking up the semiconductor chip disposed in said mount table; and
a first transportation unit for transporting the first pick-up unit to the first substrate disposed in the substrate transportation unit; and wherein the die transportation unit comprises:
a second pick-up unit for picking up the semiconductor chip disposed in said mount table; and
a second transportation unit for reciprocating the second pick-up unit between said mount table and the mount stage.

2. The die bonding apparatus according to claim 1, further comprising a substrate loader disposed at a first end portion of the substrate transportation unit and on which the first and second substrates to be bonded with the semiconductor chips are loaded; and
a substrate unloader disposed at a second end portion of the substrate transportation unit, the second end portion substantially opposing to the first end portion, and on which the substrate first and second substrates bonded with the semiconductor chips are loaded.

3. The die bonding apparatus according to claim 1, further comprising a pre-bake unit disposed adjacent to the substrate transportation unit, wherein the pre-bake unit bakes the first and second substrates at a predetermined temperature for a predetermined time.

4. The die bonding apparatus according to claim 3, wherein the pre-bake unit comprises:
a pre-bake oven for pre-baking the first and second substrates;
a loading/unloading unit for loading/unloading the first and second substrates to the pre-bake oven; and
a loader arm for transporting the first and second substrates between the substrate transportation unit and the loading/unloading unit.

5. The die bonding apparatus according to claim 1, further comprising an adhesive member forming unit adjacent to the substrate transportation unit and disposing an adhesive member at the first and second substrates.

6. The die bonding apparatus according to claim 5, wherein the adhesive member forming unit comprises:
an adhesive member roll wound with an adhesive member which has adhesiveness by heat;
a cutting unit for cutting the adhesive member to a specific length; and
a pick-up unit for picking up the adhesive member cut by the cutting unit to the first and second substrates.

7. The die bonding apparatus according to claim 6, wherein the pick-up unit includes a dispenser unit for providing an adhesive material to the first and second substrates.

8. The die bonding apparatus according to claim 1, further comprising a die supplying device including a cassette disposed adjacently to the mount table and receiving a mount frame having a mount tape to which the semiconductor chip is attached, and a mount frame transportation unit for transporting the mount frame from the cassette to the mount table.

9. The die bonding apparatus according to claim 8, further comprising a camera for photographing the semiconductor chip in the mount frame.

10. The die bonding apparatus according to claim 1, wherein the mount stage includes:
a first mount stage transportation unit for transporting the mount stage in a direction substantially in parallel to the first and second substrates; and
a second mount stage transportation unit for transporting the mount stage in a direction substantially perpendicular to the first and second substrates.

11. The die bonding apparatus according to claim 1, further comprising a second bonding head transportation unit for transporting the second bonding head in a direction perpendicular to the first and second substrates.

12. The die bonding apparatus according to claim 1, further comprising a camera disposed above the substrate transportation unit and photographing the semiconductor chip attached by the first bonding head unit.

13. The die bonding apparatus according to claim 1, further comprising a camera disposed above the mount stage and photographing positions of the mount stage and the semiconductor chip provided to the mount stage.

14. The die bonding apparatus according to claim 1, wherein the first and second substrates provided to the substrate transportation unit are a printed circuit board.

15. The die bonding apparatus according to claim 1, wherein the first and second substrates provided to the substrate transportation unit are a lead frame having a release tape.

16. The die bonding apparatus according to claim 15, wherein the substrate transportation unit further comprises a release tape separation unit for separating the release tape.

* * * * *